United States Patent
Smith

(10) Patent No.: US 6,329,692 B1
(45) Date of Patent: Dec. 11, 2001

(54) CIRCUIT AND METHOD FOR REDUCING PARASITIC BIPOLAR EFFECTS DURING ELETROSTATIC DISCHARGES

(75) Inventor: Jeremy C. Smith, Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/201,392

(22) Filed: Nov. 30, 1998

(51) Int. Cl.$^7$ .................................................. H01L 29/72
(52) U.S. Cl. ...................... 257/360; 257/255; 257/256; 257/257; 257/258; 257/261; 257/263
(58) Field of Search ........................ 251/355 T, 356, 251/357, 358, 360, 361, 363

(56) References Cited

U.S. PATENT DOCUMENTS

| | | | |
|---|---|---|---|
| 5,019,888 | 5/1991 | Scott et al. | 357/41 |
| 5,021,853 | 6/1991 | Mistry | 357/23.13 |
| 5,157,573 | 10/1992 | Lee et al. | 361/56 |
| 5,225,702 | 7/1993 | Chatterjee | 257/360 |
| 5,440,162 | 8/1995 | Worley et al. | 257/355 |
| 5,465,189 | 11/1995 | Polgreen et al. | 361/91 |
| 5,903,419 | 5/1999 | Smith | 361/56 |

OTHER PUBLICATIONS

"Substrate Triggering and Salicide Effects on ESD Performances and Protection Circuit Design in Deep Submicron CMOS Process," Amerasekera, et al; IEDM 95; pp. 575–550.

"A Substrate Triggered Lateral Bipolar Circuit for High Voltage Tolerant ESD Protection Applications," Smith.

"EOS/ESD Analysis of High–Density Logic Chips," Ramaswamy, et al; EOS/ESD Symposium 96; pp. 286–290.

"Analysis of Snubber–Clamped Diode–String Mixed Voltage Interface ESD Protection Network for Advanced Microprocessors," Voldman et al.;EOS/ESD Symposium 95; pp. 43–61.

*Primary Examiner*—Edward Wojciechowicz
(74) *Attorney, Agent, or Firm*—Daniel D. Hill

(57) ABSTRACT

A circuit (20) includes a resistor (26) and a current source (32) for raising the voltage of the source of the N-channel transistor in order to keep the base-emitter voltage of the parasitic bipolar device from forward biasing to prevent conduction in the parasitic bipolar device. In one embodiment, a relatively small resistor (26) is coupled between the source of an N-channel transistor (24) and ground. The current source (32) is used to direct some of the ESD current from a positive ESD event through the small source resistor (26) so that the source of the N-channel transistor (24) is elevated during the event, thus preventing snapback of the parasitic bipolar device.

14 Claims, 2 Drawing Sheets

CIRCUIT AND METHOD FOR REDUCING PARASITIC BIPOLAR EFFECTS DURING ELETROSTATIC DISCHARGES

FIELD OF THE INVENTION

The present invention generally relates to circuits, and more particularly, to a circuit and method for reducing parasitic bipolar effects during electrostatic discharges.

BACKGROUND OF THE INVENTION

An integrated circuit can be damaged when subjected to a voltage that is higher than the design voltage of the integrated circuit. Electrostatic discharge ("ESD"), originating from such sources as a mechanical chip carrier, a plastic chip storage device, or even a human being can generate a voltage that is many times greater than the design voltage of the integrated circuit. For example, the typical human body can supply an electrostatic discharge of up to 4 kilovolts. For integrated circuits that operate at voltages of less than, for example, 5 volts, an electrostatic discharge of such proportions can be devastating.

In order to protect the internal circuitry from high voltage, or ESD, events, protection circuits are utilized, generally between the internal circuitry and the input/output ("I/O") pins of the integrated circuit. One mechanism that can cause circuit failures during ESD events is a phenomenon known as "bipolar snapback".

FIG. 1 illustrates, in partial schematic diagram form and partial cross-sectional view, an N-channel metal-oxide semiconductor (MOS) transistor and an inherent parasitic bipolar transistor in accordance with the prior art. As FIG. 1 illustrates, an NPN bipolar device is formed in the p substrate having an emitter coupled to the source, a collector coupled to the drain, and a base coupled to the substrate of an N-channel MOS transistor. In FIG. 1, the substrate tie and the source are illustrated coupled to ground with the drain coupled to an I/O pad. The I/O pad is shown receiving a positive ESD event.

During bipolar snapback, the parasitic bipolar device formed by an n+ diffusion coupled to the bondpad (collector) and an n+ diffusion coupled to ground (emitter), can conduct large amounts of ESD discharge current by means of a self-biased mechanism through the inherent substrate resistance labeled "Rsub". The self-biasing results from avalanche-breakdown at the collector/base (i.e. n+ pad to p-substrate) diffusion where avalanche-generated electron-hole pairs are created. The avalanche-generation source is shown schematically as current source $I_{GEN}$ in FIG. 1, which represents substrate (hole) current. The holes generated from this effect migrate towards the substrate tie through the inherent substrate resistance, thereby producing a local elevation in the substrate potential near the transistor. Once this potential exceeds roughly 0.7V, it is sufficient to forward bias the base-emitter junction (i.e. n+ to p-substrate) of the parasitic device, thereby turning the device on. The drain-to-source voltage and drain current point at which parasitic bipolar action first occurs is called ($V_{T1}$, $I_{T1}$), where $I_{T1}$ is the current which is flowing due to the avalanche-generation at the drain/substrate junction. Usually, the bipolar device inherently contained in the N-channel MOS device of, for example, an output buffer is the most susceptible to snap-back. This parasitic device is frequently the point of failure in a circuit subjected to an ESD event.

One well-known solution to alleviate this parasitic bipolar problem is to add a ballast resistor connected between the drain of the N-channel MOS transistor and an output pin. This technique helps ensure some added measure of ESD protection in the event of bipolar conduction in the circuit by equally distributing any discharge current through the NMOS transistor (or several fingers forming a single NMOS transistor). The ballast resistor is added to ensure that the failure point at another collector-to-emitter voltage $V_{T2}$, is greater than the collector-to-emitter voltage, $V_{T1}$, where the current begins to flow in the parasitic bipolar transistor. The relationship between $V_{T1}$ and $V_{T2}$ is illustrated in FIG. 2.

FIG. 2 illustrates a diagram of drain current versus drain voltage of the N-channel transistor of FIG. 1. FIG. 2 shows two curves. One curve illustrates drain current versus drain-to-source voltage for a typical non-salicided technology and the other curve illustrates drain current versus drain-to-source voltage for a typical salicided technology. When several NMOS transistors (or several fingers forming a single NMOS transistor) act as a parasitic bipolar device, such a device relies upon the "snap-back" current-voltage characteristics of the inherent parasitic bipolar transistor. As stated above, a current begins to flow through the bipolar transistor at a certain collector-to-emitter voltage, $V_{T1}$. Thereafter the collector-to-emitter voltage decreases as the current increases, "snapping back" from $V_{T1}$. As drain voltage increases, the trend reverses, causing the collector-to-emitter voltage to rise as the current also rises. Eventually, the bipolar transistor fails at another particular collector-to-emitter voltage $V_{T2}$. In a typical non-salicided technology, $V_{T2}$ is usually greater than $V_{T1}$ since the on-resistance exhibited by the transistor is quite high (i.e. the slope of the line in FIG. 2 is less steep). In a typical salicided technology, $V_{T2}$ is usually less than $V_{T1}$, since the salicided source/drain diffusions act to lower the effective series resistance of the device (i.e. the slope of the line in FIG. 2 is more steep). In either technology, $V_{T2}$ can be controlled to be greater than $V_{T1}$ by adding series resistance in the form of a ballast resistor. This guarantees that the first NMOS transistor (or finger of the NMOS transistor) does not break down at a voltage less than the voltage at which the second NMOS transistor turns on. This in turn guarantees that the failure current of the complete device is the sum total of its individual components rather than that of the first segment which snaps-back. The failure current is the second breakdown current, $I_{T2}$, shown in FIG. 2. The value of $I_{T2}$ must not be exceeded during an ESD event or else permanent damage will result in the device. Thus, the motivation for adding ballast resistance is to maximize the total amount of $I_{T2}$ available from a given transistor. In general, $I_{T2}$ depends on specific fabrication parameters of a particular technology, and varies from technology to technology.

The general trend with semiconductor technology scaling has been a reduction in $I_{T2}$ for each new generation of technology. This is due to several factors such as the use of shallow, salicided source/drain junctions and the use of epitaxial layer on heavily doped p+ substrates. In addition to promoting poor width-scaling in multi-finger devices, the salicide layer also consumes a significant portion of the junction depth which is also known to reduce second breakdown failure current thresholds ($I_{T2}$). Epitaxial layer on heavily doped p+ substrates (epi-substrates), are needed in advanced technologies to inhibit the well known latch-up effect. Epi-substrates exhibit a very low substrate resistance, which allows the substrate potential to be closely coupled to ground all over the chip. While this is desirable for avoiding latch-up, it severely impedes parasitic bipolar action since it becomes difficult to uniformly initiate and sustain bipolar action.

BRIEF DESCRIPTION OF THE DRAWINGS

A better understanding of the present invention can be obtained when the following detailed description of a pre

Figure 1:
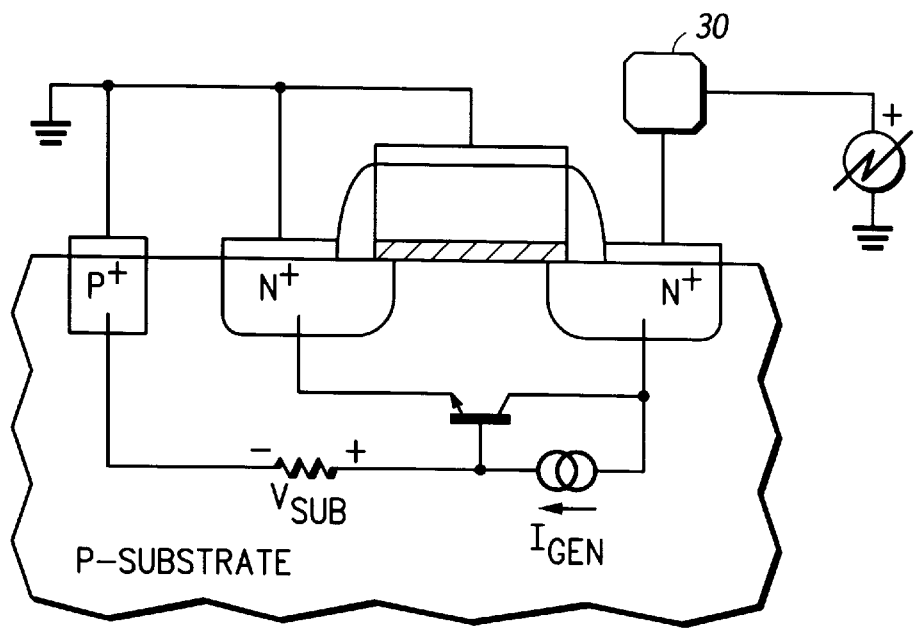
- FIG. 1 illustrates, in partial schematic diagram form and partial cross-sectional view, an N-channel MOS transistor and an inherent parasitic bipolar transistor in accordance with the prior art.
Figure 2:
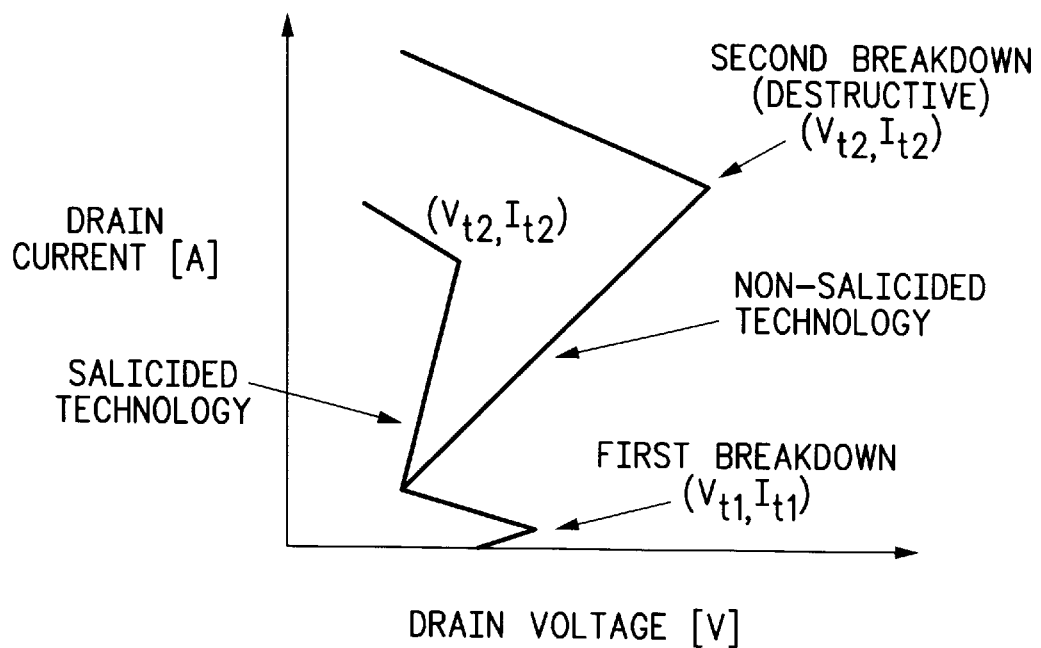
FIG. 2 illustrates a diagram of drain current versus drain voltage of the N-channel MOS transistor of FIG. 1.

It will be appreciated that for simplicity and clarity of illustration, elements illustrated in the drawings have not necessarily been drawn to scale. For example, the dimensions of some of the elements are exaggerated relative to other elements for purposes of clarity. Further, where considered appropriate, reference numerals have been repeated among the drawings to represent corresponding or analogous elements.

DETAILED DESCRIPTION OF A PREFERRED EMBODIMENT

While several embodiments of the present invention will be described in detail below, the present invention common to all embodiments lies in a circuit and method for raising the voltage of the source of the N-channel transistor in order to keep the base-emitter voltage of the parasitic bipolar device from forward biasing, to prevent conduction in the parasitic bipolar device. The present invention prevents bipolar snapback in advanced semiconductor technologies where an almost instantaneous destruction of the device occurs once $V_{T1}$ has been exceeded (i.e., $V_{T2}=V_{T1}$ and $I_{T2}=I_{T1}$). For these devices, it is not sufficient to ameliorate the effects of bipolar snapback once it has occurred, since a very low value of failure current, $I_{T2}$, is exhibited. Rather, for these technologies, it is desirable to avoid snapback altogether and care must be taken to increase the value of $V_{T1}$ so that the output buffer NMOS device does not snapback during an ESD discharge. This significantly differs from the conventional wisdom of trying to control parasitic bipolar action after snapback with well-known techniques such as ballasting.

Figure 3:
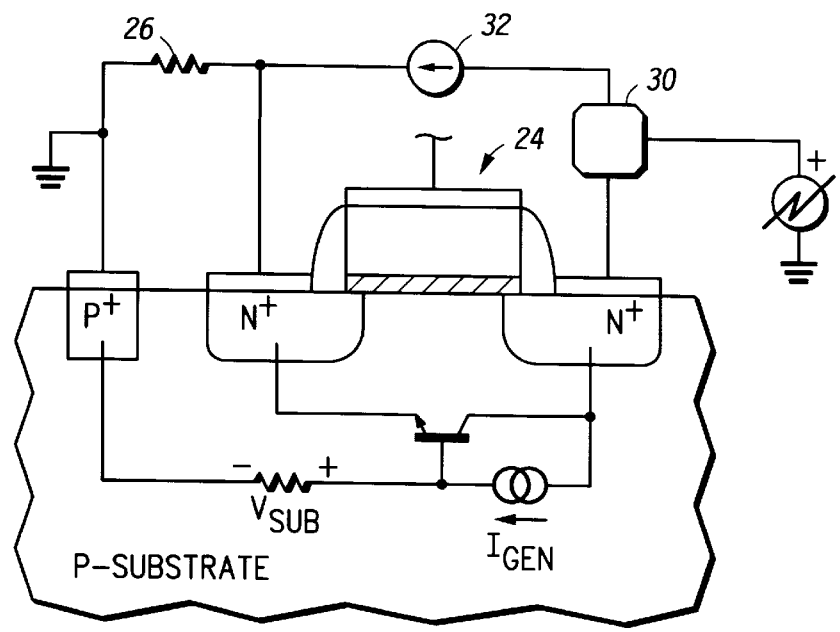
FIG. 3 illustrates, in partial schematic diagram form and partial cross-sectional view, an ESD circuit in accordance with the present invention

FIG. 3 shows one embodiment where, a relatively small resistor (26) is coupled between the source of the N-channel transistor (24) and ground. A source injection current source (32) is used to direct some of the ESD current from a positive ESD event through the small source resistor so that the source of the N-channel transistor is elevated during the event, thus preventing a forward biasing of the base-emitter junction which in-turn causes snapback of the inherent parasitic bipolar device. Thus, a positive potential is produced by current flow through resistor 26, at the cathode (n+ diffusion) of the diode formed between the source of transistor 24 and the p-type substrate (anode). The magnitude of this potential can easily be controlled by adjusting the value of resistor 26 or the relative strength of source injection current source 32. Conversely, the potential of the anode (substrate) of the diode formed by the n+ source diffusion of transistor 24 is controlled by the avalanche-generation rate and effective substrate resistance, which in general, are difficult to engineer independently of other fabrication parameters. Thus, by using the described invention, snapback can be controlled in a manner which does not alter or effect other physical or electrical parameters which are needed elsewhere in the fabrication process.

A specific embodiment of the present invention will now be described in detail with reference to FIG. 4.

Figure 4:
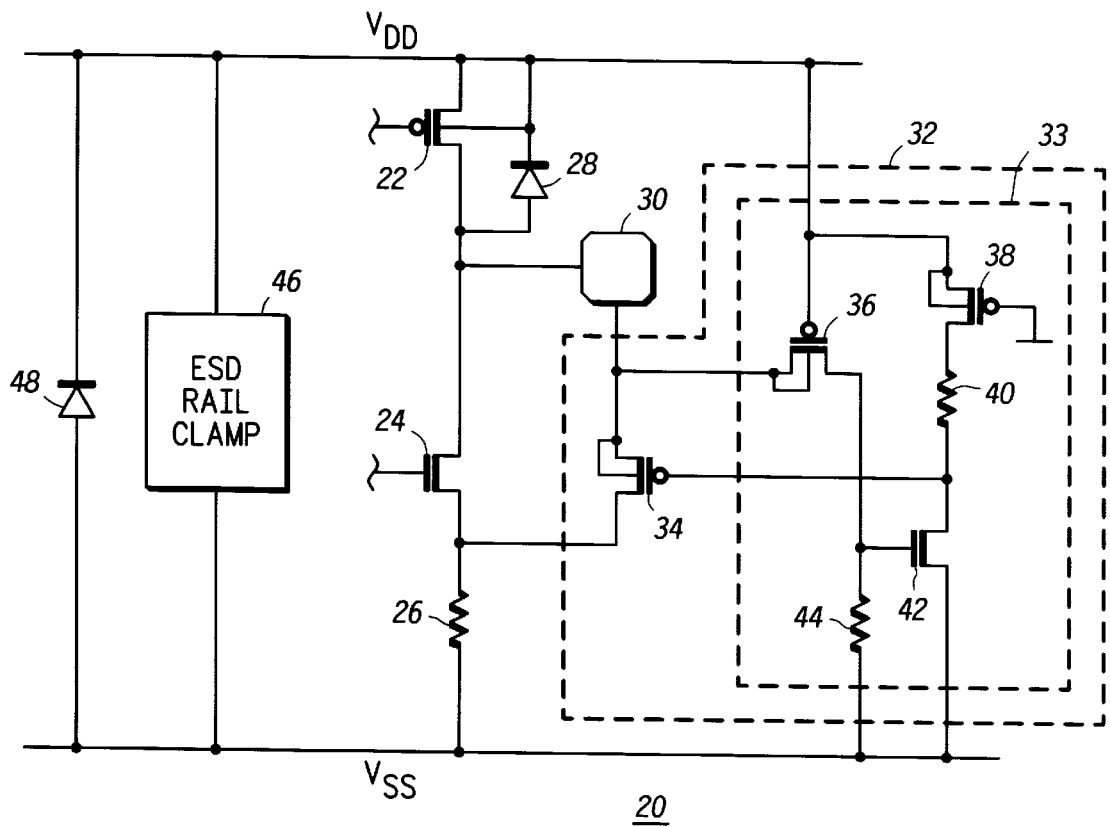
FIG. 4 illustrates, in schematic diagram form, an ESD circuit in accordance with the present invention.

FIG. 4 illustrates, in schematic diagram form, an output buffer circuit 20 in accordance with the present invention. Output buffer circuit 20 is an output buffer circuit having ESD protection, and includes P-channel transistor 22, N-channel transistor 24, resistor 26, pad 30, a source injection current source 32 which is further comprised of a source injection bias circuit 33 and a source injector transistor 34, ESD rail clamp 46, and diode 48. P-channel transistor 22 and N-channel transistor 24 together form an output buffer circuit. P-channel transistor 22 is illustrated with its inherent diode 28 coupled between its drain and well. P-channel source injector transistor 34 has a source coupled to pad 30, a gate, and a drain coupled to one terminal of resistor 26. The gate of P-channel source injector transistor 34 is biased by source injection bias circuit 33.

Source injection bias circuit 33 includes P-channel transistors 36 and 38, resistors 40 and 44, and N-channel transistor 42. P-channel transistor 36 has a gate connected to VDD, a first source terminal connected to pad 30, and a second drain terminal. P-channel transistor 38 has a source connected to a positive power supply voltage terminal labeled VDD, a gate connected to ground, and a drain. Resistor 40 has a first terminal connected to the drain of P-channel transistor 38, and a second terminal. N-channel transistor 42 has a drain connected to the second terminal of resistor 40, a gate connected to the second drain terminal of P-channel channel transistor 36, and a source connected to VSS. Resistor 44 has a first terminal connected to the gate of N-channel transistor 42, and a second terminal connected to a ground terminal labeled VSS. ESD rail clamp 46 and diode 48 are coupled between VDD and VSS. ESD rail clamp 46 may be the inherent capacitance of the integrated circuit incorporating circuit 20, or may be an active clamp circuit used to provide a discharge path between VDD and VSS during an ESD event. Diode 48 conducts current when VSS is about a diode voltage drop ($V_d$) above VDD.

During normal operation of the output buffer circuit, the gates of transistors 22 and 24 are biased by internal circuits which are not shown in FIG. 4, causing either P-channel transistor 22 or N-channel transistor 24 to conduct as necessary to drive pad 30 to the required voltage. Source injection bias circuit 33 places source injector transistor 34 into a non-conductive state to minimize current leakage. P-channel transistor 36 will be substantially non-conductive, causing the voltage at the gate of N-channel transistor 42 to be low, and causing transistor 42 to be non-conductive. This in turn causes the voltage at the second terminal of resistor 40 to be high enough to cause P-channel source injector transistor 34 to be substantially non-conductive.

During a positive ESD event, or other high voltage event, source injection bias circuit 33 maintains P-channel source injector transistor 34 in a conductive state. P-channel source injector transistor 34 then functions as a current source. P-channel transistor 36 becomes conductive when the voltage at pad 30 exceeds one threshold voltage drop above VDD, causing a relatively high voltage to be supplied to the gate of N-channel transistor 42. N-channel transistor 42 then becomes conductive causing the gate of P-channel transistor 34 to be pulled low, causing source injector P-channel transistor 34 to be conductive. Some of the ESD current is conducted from pad 30, through P-channel source injector transistor 34 and resistor 26 to VSS. The rest of the ESD event current flows through the inherent diode 28 of P-channel transistor 22 to VDD and then via ESD rail clamp 46 to VSS.

By causing some ESD current to flow through source injector transistor 34 and resistor 26, the source voltage of N-channel transistor 24 is increased, thus raising the emitter voltage of the inherent bipolar transistor (as illustrated in FIG. 1 and FIG. 3) preventing the inherent bipolar transistor from becoming conductive. This increases the pad voltage that can build up during an ESD event beyond that at which snapback would normally occur, which as discussed above, is particularly destructive to integrated circuits constructed using advanced, salicided technology.

The upper limit on the resistance of resistor 26 is determined by the length of turn-on delay caused by resistor 26 to N-channel transistor 24. Only a small voltage on the source of N-channel transistor 24 is enough to prevent conduction of the parasitic bipolar device because the substrate potential cannot rise very high because the substrate is coupled to ground. The source of N-channel transistor 24 just needs to be a diode drop above the substrate to prevent bipolar snapback from occurring. In the illustrated embodiment, resistor 26 is implemented having a resistance value of about 10 ohms or less.

In an alternate embodiment, instead of using source injection bias circuit 33, the gate of P-channel source injector transistor 34 can be connected directly to VDD. While this approach would still permit source injector transistor 34 to inject current into resistor 26, the amount of current would decrease as VDD begins to rise sympathetically with the pad 30. This causes the source-to-gate voltage of source injector transistor 34 to decrease in magnitude which de-biases the device. However, an advantage to using source injection bias circuit 33 is that if VDD begins to move sympathetically with pad 30, a source-to-gate voltage sufficient to keep P-channel source injector transistor 34 highly conductive is maintained because transistor 36 needs to supply only a very small current to resistor 44 to cause the voltage across resistor 44 to exceed the threshold voltage of N-channel transistor 42. While transistor 36 is still susceptible to this de-bias effect, the value of resistor 44 can easily be adjusted so that N-channel transistor 42 stays conductive, insuring that the gate voltage of transistor 34 is low enough to cause P-channel source injector transistor 34 to remain highly conductive.

The use of resistor 26 with the current source 32 formed by source injector transistor 34 and source injector bias circuit 33 can greatly extend the ESD range of the buffer circuit before breakdown occurs, which gives the ESD protection circuit more margin before failure of the device.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A semiconductor device comprising:
   a terminal;
   an current source having a first node coupled to the terminal, and a second node for providing a current in response to an electrostatic discharge (ESD) on the terminal;
   a first resistive element having a first node coupled to a first voltage reference node, and a second node coupled to the second node of the current source; and
   a first transistor having a control electrode, a first current electrode coupled to the terminal, and a second current electrode coupled to the second node of the current source.

2. The semiconductor device of claim 1, wherein the first transistor is an N-channel transistor.

3. The semiconductor device of claim 2, wherein the first current electrode of the first transistor is a drain electrode, and the second current electrode is a source electrode.

4. The semiconductor device of claim 1, wherein the current source further comprises a second transistor having a control gate, a first current electrode coupled to the first node of the current source, and a second current electrode coupled to the second node of the current source.

5. The semiconductor device of claim 4, wherein the control gate of the second transistor is coupled to a second voltage reference node.

6. The semiconductor device of claim 4, wherein the second transistor is a P-channel transistor.

7. The semiconductor device of claim 4 wherein the current source further comprises a feed back circuit including a third transistor having a control electrode coupled to the first node of the current source, a first current electrode coupled to a first voltage reference node, and a second current electrode coupled to the control electrode of the second transistor.

8. The semiconductor device of claim 7, wherein during an ESD event the first voltage reference node and the second voltage reference node are for providing substantially a same voltage.

9. The semiconductor device of claim 7 further comprising:
   a fourth transistor having a control electrode, a first current electrode coupled to the terminal, and a second current electrode coupled to the control electrode of the third transistor; and
   a second resistive element having a first node coupled to the control electrode of the third transistor, and a second node coupled to a first voltage reference node.

10. A semiconductor device comprising:
    a bond pad;
    an N-type transistor having a control node, a first current electrode coupled to the bond pad, and a second current electrode;
    a P-type transistor having a control node, a first current electrode coupled to a first voltage reference terminal, a second current electrode coupled to the first current electrode of the N-type transistor; and
    a voltage source having an output node coupled to the second current electrode of the N-type transistor for providing a voltage, and an input node coupled to the bond pad for controlling a voltage value at the output node of the voltage source.

11. The semiconductor device of claim 10 further comprising:
    a electrostatic discharge clamp having a first node coupled to the first voltage reference terminal, and a second node coupled to a second voltage reference terminal.

12. The semiconductor device of claim 10, wherein the voltage source further comprises:
    a first resistive element having a first node coupled to the output node of the voltage source, and a second node coupled to a second voltage reference terminal; and
    a current source having a first node coupled to the input node of the voltage source, and a second node coupled to the output node of the voltage source.

13. The semiconductor device of claim 12, wherein the current source comprises:
    a first transistor of a first conductivity type having a control node coupled to the first voltage reference terminal, a first current electrode coupled to the bond pad, and a second current electrode;

a second transistor of the first conductivity type having a control node, a first current electrode coupled to the bond pad, and a second current electrode coupled to the output node of the voltage source;

a third transistor of a second conductivity type having a control node coupled to the second current electrode of the first transistor, a first current electrode coupled to the control electrode of the second transistor, and a second current electrode coupled to the second voltage reference terminal; and a second resistive element having a first node coupled to the control node of the third transistor, and a second node coupled to the second voltage reference terminal.

14. The semiconductor device of claim 12, wherein the current source comprises:

a first transistor of a first conductivity type having a control node coupled to the first voltage reference terminal, a first current electrode coupled to the bond pad, and a second current electrode coupled to the output node of the voltage source.

* * * * *